US010763380B2

(12) United States Patent
Hofrichter et al.

(10) Patent No.: US 10,763,380 B2
(45) Date of Patent: Sep. 1, 2020

(54) PHOTODETECTOR DEVICE WITH INTEGRATED HIGH-CONTRAST GRATING POLARIZER

(71) Applicant: ams AG, Premstätten (AT)

(72) Inventors: Jens Hofrichter, Gattikon (CH); Jan Enenkel, Gratkorn (AT)

(73) Assignee: ams AG, Premstaetten (AT)

( * ) Notice: Subject to any disclaimer, the term of this patent is extended or adjusted under 35 U.S.C. 154(b) by 0 days.

(21) Appl. No.: 16/311,470

(22) PCT Filed: Jun. 13, 2017

(86) PCT No.: PCT/EP2017/064415
§ 371 (c)(1),
(2) Date: Dec. 19, 2018

(87) PCT Pub. No.: WO2017/220380
PCT Pub. Date: Dec. 28, 2017

(65) Prior Publication Data
US 2019/0198686 A1  Jun. 27, 2019

(30) Foreign Application Priority Data
Jun. 20, 2016 (EP) ..................... 16175275

(51) Int. Cl.
H01L 31/0232 (2014.01)
(52) U.S. Cl.
CPC .............. H01L 31/02327 (2013.01)

(58) Field of Classification Search
CPC ........................ H01L 27/1462–14623; H01L 27/14625–14629; H01L 31/02162–02165; H01L 31/02327; G02B 5/00; G02B 1/00
See application file for complete search history.

(56) References Cited

U.S. PATENT DOCUMENTS

| | | | |
|---|---|---|---|
| 6,617,189 B1 * | 9/2003 | Chen | ................ H01L 27/14621 257/233 |
| 2007/0115553 A1 | 5/2007 | Chang-Hasnain et al. | |
| 2010/0244168 A1 * | 9/2010 | Shiozawa | ......... H01L 27/14621 257/432 |
| 2014/0353530 A1 | 12/2014 | Chang-Hasnain et al. | |

(Continued)

FOREIGN PATENT DOCUMENTS

| | | |
|---|---|---|
| EP | 2746826 | 6/2014 |
| FR | 3015113 | 6/2015 |

OTHER PUBLICATIONS

Chang-Hasnain, C. J. et al.: "High-contrast gratings for integrated optoelectronics" Advances in Optics and Photonics 4, 379-440 (2012).

(Continued)

Primary Examiner — Tucker J Wright
(74) Attorney, Agent, or Firm — Fish & Richardson P.C.

(57) ABSTRACT

The photodetector device comprises a substrate (1) of semiconductor material, a sensor region (2) in the substrate, a plurality of grid elements (4) arranged at a distance (d) from one another above the sensor region, the grid elements having a refractive index, a region of lower refractive index (3), the grid elements being arranged on the region of lower refractive index, and a further region of lower refractive index (5) covering the grid elements.

15 Claims, 2 Drawing Sheets

(56) References Cited

U.S. PATENT DOCUMENTS

2014/0353583 A1  12/2014  Chang-Hasnain et al.
2015/0053922 A1   2/2015  Nakajima et al.

OTHER PUBLICATIONS

Guillaumée, M. et al.: "Polarization sensitive silicon photodiodes using nanostructured metallic grids" Applied Physics Letters 94, 193503 (2009).
Hofmann, W. et al.: "Long-Wavelength High-Contrast Grating Vertical-Cavity Surface-Emitting Emitting Laser" IEEE Photonics Journal 2, 415-422 (2010).
Stöferle, T. et al.: "Ultracompact Silicon/Polymer Laser with an Absorption-Insensitive Nanophotonic Resonator" Nano Letters 10, 3675-3678 (2010).
European Patent Office, International Search Report for PCT/EP2017/064415, dated Aug. 9, 2017.

\* cited by examiner

PHOTODETECTOR DEVICE WITH INTEGRATED HIGH-CONTRAST GRATING POLARIZER

The present invention relates to the field of semiconductor devices for the detection of electromagnetic radiation.

BACKGROUND OF THE INVENTION

The electric and magnetic field vectors of electromagnetic radiation are perpendicular to each other and to the direction of propagation. In polarized light, the distribution of these vectors is not arbitrary, but ordered rather. Linear polarization is characterized by a constant direction of the electric field vector. Circular polarization is present when the electric field vector has a constant length and rotates around the direction of propagation. These are special cases of elliptical polarization, in which the terminal point of the electric field vector describes an ellipse in any fixed plane that is normal to and intersects the direction of propagation.

The signal-to-noise ratio of a photodiode can be enhanced if only certain states of polarization are detected. This is especially favorable when ambient light, in particular bright sunlight, interferes with the reception of a light signal to be detected and the signal has a lower intensity than the ambient light.

Polarizing filters are used in cameras to reduce oblique reflections from non-metallic surfaces, in particular light reflected from the ground. Time-of-flight sensors emit a polarized laser beam, which is reflected from a surface and detected by the sensor. Therefore, it would be advantageous to provide means to only detect light having the same state of polarization as the laser, while filtering out the other undesired states of polarization.

Wire grid polarizers comprise parallel wires or similar lines of metal arranged at equal distances from one another in a plane that is oblique or perpendicular to the incident light. Electrons in the wires are driven in the direction of the electric field vector of an electromagnetic wave propagating through the wire grid. The unrestricted movement of electrons along the longitudinal extension of the wires makes the wire grid act as a mirror, whereas the movement of the electrons in the transverse direction is confined by the small width of the wires. Hence the vector component of the electric field vector that is parallel to the direction of the longitudinal extension of the wires defines a portion of the incident light that is essentially reflected, whereas the vector component of the electric field vector that is perpendicular to the direction of the longitudinal extension of the wires defines a portion of the incident light that is essentially transmitted. The electric field vector of the transmitted light is therefore perpendicular to the wires, and a linear polarization is thus obtained by the wire grid.

The sum of the width of one wire and the distance between adjacent wires is the pitch of the grid and corresponds to a minimal period of the regular lattice formed by the grid. The distance between adjacent wires is typically smaller than the wavelength of the radiation.

Wire grid polarizers are used in semiconductor devices. In a CMOS process, for instance, parallel metal lines forming a wire grid can be produced in the back end of line, where the components of an integrated circuit are electrically connected by a wiring including structured metallization layers embedded in an intermetal dielectric.

High-contrast grating-based reflectors are used as reflectors in advances vertical cavity surface-emitting lasers (VCSELs). These reflectors have the property that only one state of polarization is reflected thus fostering emission with one polarization state only. Moreover, high-contrast grating reflectors consisting of a single layer are easier to manufacture than the commonly use Bragg-reflectors, where about 30 to 50 layers are requires to achieve a meaningful reflection coefficient.

US 2007/0115553 A1 discloses a sub-wavelength grating structure for broadband mirrors and high-reflectivity gratings. The device comprises a substrate layer of silicon, a layer of low refractive index, like $SiO_2$, and sections of a material of high refractive index, like polysilicon, spaced apart from one another and arranged on the layer of low refractive index.

US 2014/0353583 A1 and US 2014/0353530 A1 disclose polarization independent photodetectors with high-contrast gratings arranged above an air gap.

M. Guillaumée et al., "Polarization sensitive silicon photodiodes using nanostructured metallic grids", Applied Physics Letters 94, 193503 (2009), present design, fabrication and characterization of wire grid polarizers with dimensions that are compatible with CMOS technology.

W. Hofmann et al., "Long-Wavelength High-Contrast Grating Vertical-Cavity Surface-Emitting Laser", IEEE Photonics Journal 2, 415-422 (2010), present a VCSEL structure based on a subwavelength high-contrast grating reflector consisting of amorphous silicon on isolator as the output mirror.

T. Stöferle et al., "Ultracompact Silicon/Polymer Laser with an Absorption-Insensitive Nanophotonic Resonator", Nano Letters 10, 3675-3678 (2010), for which supporting online material is available, present a planar nanophotonic resonator and a high-contrast grating mirror made from dielectric material as a subwavelength phase grating employed as an in-plane reflector in a laser cavity.

C. J. Chang-Hasnain and W. Yang, "High-contrast gratings for integrated optoelectronics", Advances in Optics and Photonics 4, 379-440 (2012), give an overview of high-contrast gratings and the underlying physical principles.

Light absorption in the metal lines of a wire grid polarizer may reduce the responsivity of the sensor that is provided with the wire grid polarizer. The effect of the wire grid depends on the angle of incidence, owing to the height of the metal lines, and the angular polarization dependency may be relatively large resulting in tight tolerances. Furthermore, the extinction ratio of a state of polarization that is not to be detected is limited by the extinction coefficient of the metal.

SUMMARY OF THE INVENTION

The photodetector device comprises a substrate of semiconductor material, a sensor region in the substrate for the detection of electromagnetic radiation, a plurality of grid elements arranged at a distance from one another above the sensor region, the grid elements having a refractive index, a region of lower refractive index, the grid elements being arranged on the region of lower refractive index, and a further region of lower refractive index covering the grid elements. In particular, the grid elements can be arranged immediately on the region of lower refractive index.

In embodiments of the photodetector device, the grid elements comprise polysilicon, silicon nitride, hafnium dioxide, tantalum pent-oxide, silicon dioxide, niobium pentoxide, or any combination thereof.

In a further embodiment, the region of lower refractive index is a shallow trench isolation, buried oxide or field oxide region formed in the substrate, and the further region of lower refractive index comprises a dielectric layer.

In a further embodiment, the region of lower refractive index is a cover layer above the substrate, and the further region of lower refractive index comprises ambient air. In this embodiment the grid elements may comprise silicon nitride.

In a further embodiment, the refractive index of the grid elements is at least 0.5 larger than the refractive index of the region of lower refractive index.

In a further embodiment, the refractive index of the grid elements is at least 1.0 larger than the refractive index of the further region of lower refractive index.

The grid elements may have a constant width. For a wavelength of electromagnetic radiation to be detected, the sum of the width and the distance between adjacent grid elements may be smaller than the wavelength in the region of lower refractive index and/or in the further region of lower refractive index or even smaller than the wavelength in the grid elements. The sum of the width and the distance between adjacent grid elements may be larger than a quarter of the wavelength in the grid elements. The length of the grid elements, which is perpendicular to their width and parallel to the direction of their alignment, may be larger than the wavelength in the grid elements.

The following is a detailed description of examples and embodiments of the photodetector device in conjunction with the appended figures.

DETAILED DESCRIPTION

Figure 1:
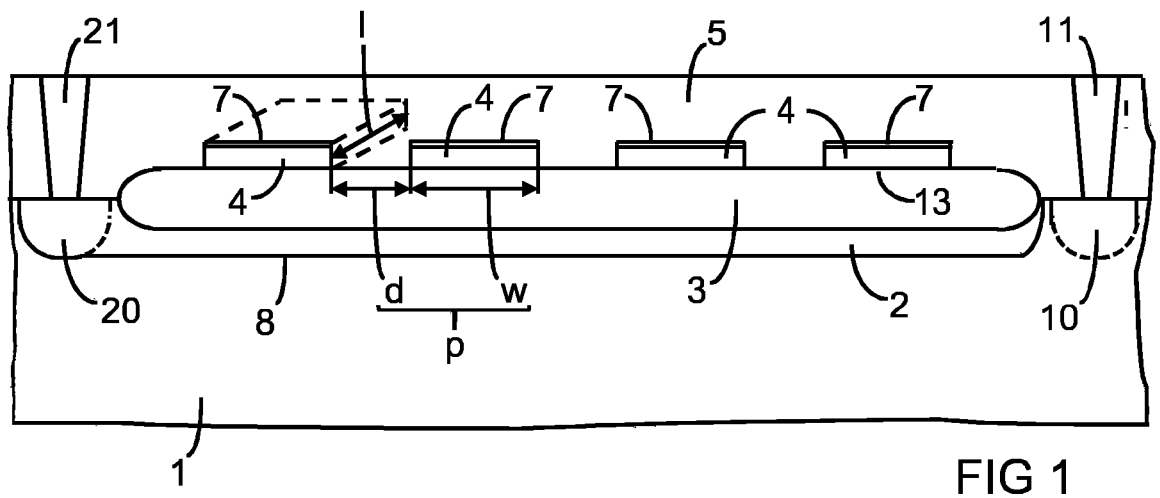
FIG. 1 is a cross section of a photodetector device with a high-contrast grating polarizer.

FIG. 1 is a cross section of a photodetector device with a high-contrast grating polarizer. The photodetector device comprises a substrate 1 of semiconductor material, which may be silicon, for instance. A photodetector or photodetector array suitable for detecting electromagnetic radiation, especially light within a specified range of wavelengths, is arranged in the substrate 1. An integrated circuit for the operation of the photodetector or photodetector array may also be provided in the substrate 1.

The photodetector or photodetector array may comprise any conventional photodetector structure and is therefore only schematically represented in the appended figures by a sensor region 2 in the substrate 1. The sensor region 2 may extend continuously as a layer of the substrate 1, or it may be divided into sections according to a photodetector array.

The substrate 1 may be doped for electric conductivity at least in a region adjacent to the sensor region 2, and the sensor region 2 may be doped, either entirely or in separate sections, for the opposite type of electric conductivity. If the substrate 1 has p-type conductivity the sensor region 2 has n-type conductivity, and vice versa. Thus a pn-junction 8 or a plurality of pn-junctions 8 is formed at the boundary of the sensor region 2 and can be operated as a photodiode or array of photodiodes by applying a suitable voltage. This is only an example, and the photodetector or photodetector array may comprise different structures.

A contact region 10 or a plurality of contact regions 10 comprising an electric conductivity that is higher than the conductivity of the adjacent semiconductor material may be provided in the substrate 1 outside the sensor region 2, especially by a higher doping concentration. A further contact region 20 or a plurality of further contact regions 20 comprising an electric conductivity that is higher than the conductivity of the sensor region 2 may be arranged in the substrate 1 contiguous to the sensor region 2 or a section of the sensor region 2. An electric contact 11 can be applied on each contact region 10 and a further electric contact 21 can be applied on each further contact region 20 for external electric connections.

An isolation region 3 may be formed above the sensor region 2. The isolation region 3 is transparent or at least partially transparent to the electromagnetic radiation that is to be detected and has a refractive index for the relevant wavelengths of interest. The isolation region 3 comprises a dielectric material like a field oxide, for instance. If the semiconductor material is silicon, the field oxide can be produced at the surface of the substrate 1 by local oxidation of silicon (LOCOS). As the volume of the material increases during oxidation, the field oxide protrudes from the plane of the substrate surface as shown in FIG. 1.

Grid elements 4 are arranged at a distance d from one another on the surface 13 of the isolation region 3 above the sensor region 2. In particular, the grid elements 4 can be arranged immediately on the surface 13 of the isolation region 3. The grid elements 4 may have the same width w, and the distance d may be the same between any two adjacent grid elements 4. The sum of the width w and the distance d is the pitch p, which is a minimal period of the regular lattice formed by the grid elements 4. The length l of the grid elements 4, which is perpendicular to their width w, is indicated in FIG. 1 for one of the grid elements 4 in a perspective view showing the hidden contours by broken lines.

The grid elements 4 are transparent or at least partially transparent to the electromagnetic radiation that is to be detected and have a refractive index for the relevant wavelengths. The grid elements 4 may comprise polysilicon, silicon nitride or niobium pentoxide, for instance. The use of polysilicon for the grid elements 4 has the advantage that the grid elements 4 can be formed in a CMOS process together with the formation of polysilicon electrodes or the like.

The refractive index of the isolation region 3 is lower than the refractive index of the grid elements 4. The isolation region 3 is an example of the region of lower refractive index recited in the claims.

The grid elements 4 are covered by a further region of lower refractive index. In the photodetector device according to FIG. 1, the grid elements 4 are covered by a dielectric layer 5 comprising a refractive index that is lower than the refractive index of the grid elements 4. The dielectric layer 5 may especially comprise borophosphosilicate glass (BPSG), for instance, or silicon dioxide, which is employed in a CMOS process to form intermetal dielectric layers of the wiring. The grid elements 4 are thus embedded in material of lower refractive index and form a high-contrast grating polarizer.

An antireflective coating 7 may be applied on the grid elements 4. It may be formed by removing the dielectric layer 5 above the grid elements 4, depositing a material that is suitable for the antireflective coating 7, and filling the openings with the dielectric material of the dielectric layer 5. The antireflective coating 7 may especially be provided to match the phase of the incident radiation to its propagation constant in the substrate 1. In particular, if the substrate 1 comprises silicon, the refractive index of the antireflective coating 7 may be at least approximately the square root of the refractive index of silicon. Silicon nitride may be used for the antireflective coating 7, for instance.

Figure 2:
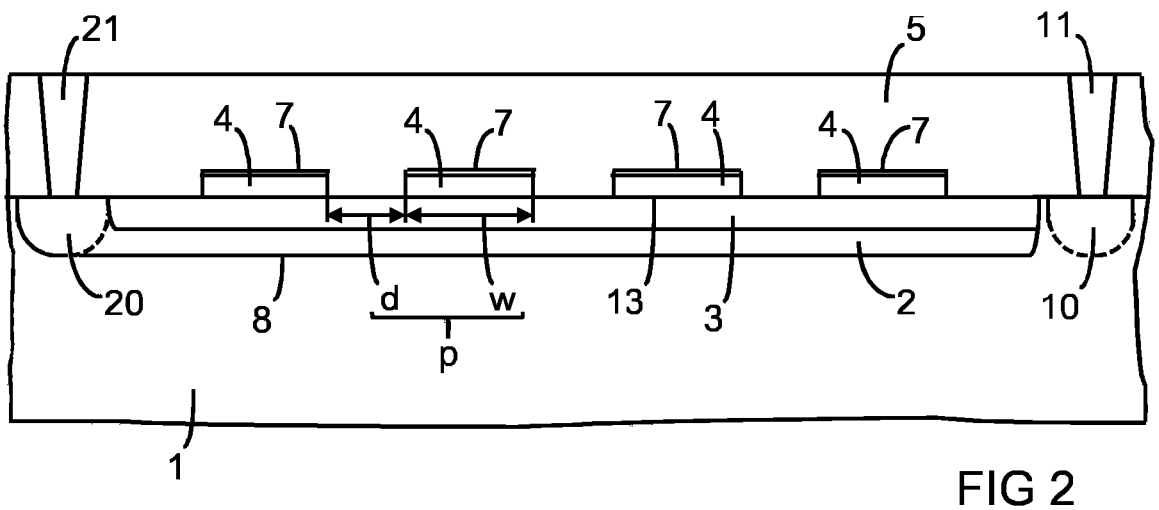
FIG. 2 is a cross section of a further photodetector device with a high-contrast grating polarizer.

FIG. 2 is a cross section of a further photodetector device with a high-contrast grating polarizer. Elements that correspond to similar elements shown in FIG. 1 are designated with the same reference numerals. The photodetector device according to FIG. 2 differs from the photodetector device according to FIG. 1 in the isolation region 3, which is formed as a shallow trench isolation (STI). If the semiconductor material is silicon, the material of the isolation region 3 may be silicon dioxide, for instance. The refractive index of the isolation region 3 is lower than the refractive index of the grid elements 4. The isolation region 3 formed as a shallow trench isolation is a further example of the region of lower refractive index recited in the claims.

Figure 3:
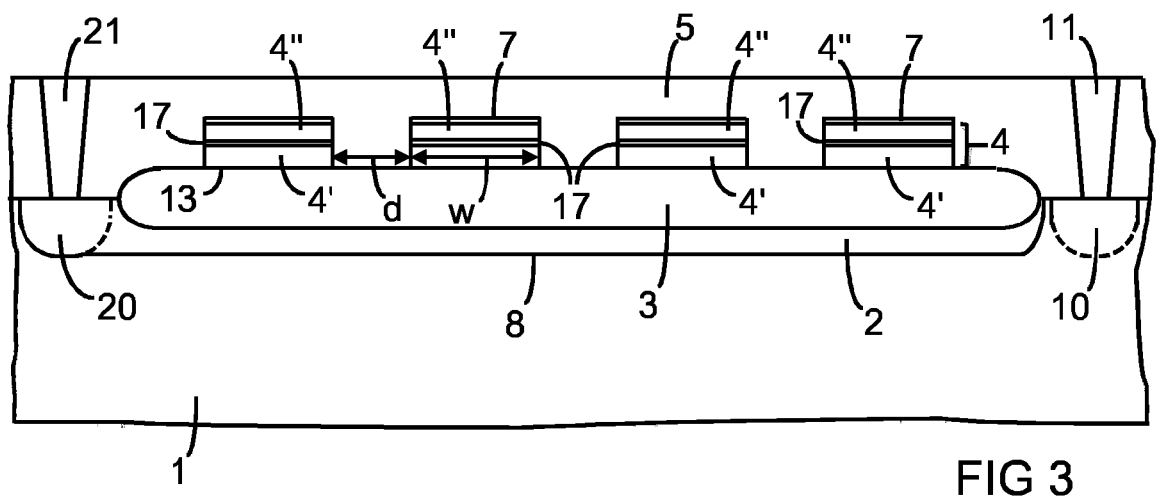
FIG. 3 is a cross section according to FIG. 1 for a photodetector device with a high-contrast grating polarizer comprising partial layers.

FIG. 3 is a cross section of a further photodetector device with a high-contrast grating polarizer. Elements that correspond to similar elements shown in FIG. 1 are designated with the same reference numerals. The photodetector device according to FIG. 3 differs from the photodetector device according to FIG. 1 in the formation of the grid elements 4, which comprise partial layers 4', 4". The lower partial layer 4' may be formed by sections of a polysilicon layer, for instance. An intermediate layer 17, which may comprise at least one oxide layer, for example, is optionally applied on the lower partial layer 4' before the upper partial layer 4" is formed. The upper partial layer 4" may be formed by sections of a further polysilicon layer, for instance.

Figure 4:
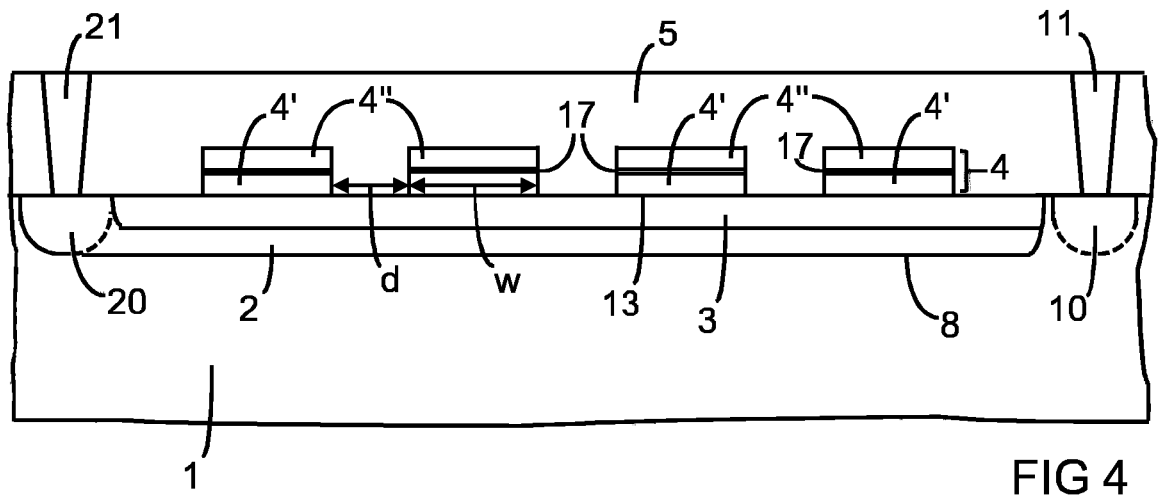
FIG. 4 is a cross section according to FIG. 3 for a further photodetector device with a high-contrast grating polarizer comprising partial layers.

FIG. 4 is a cross section of a further photodetector device with a high-contrast grating polarizer. Elements that correspond to similar elements shown in FIG. 3 are designated with the same reference numerals. The photodetector device according to FIG. 4 differs from the photodetector device according to FIG. 3 in the isolation region 3, which is formed as a shallow trench isolation (STI) as in the photodetector device according to FIG. 2. If the semiconductor material is silicon, the material of the isolation region 3 may be silicon dioxide, for instance. In FIG. 4 the grid elements 4 are shown without antireflective coating, by way of example.

Figure 5:
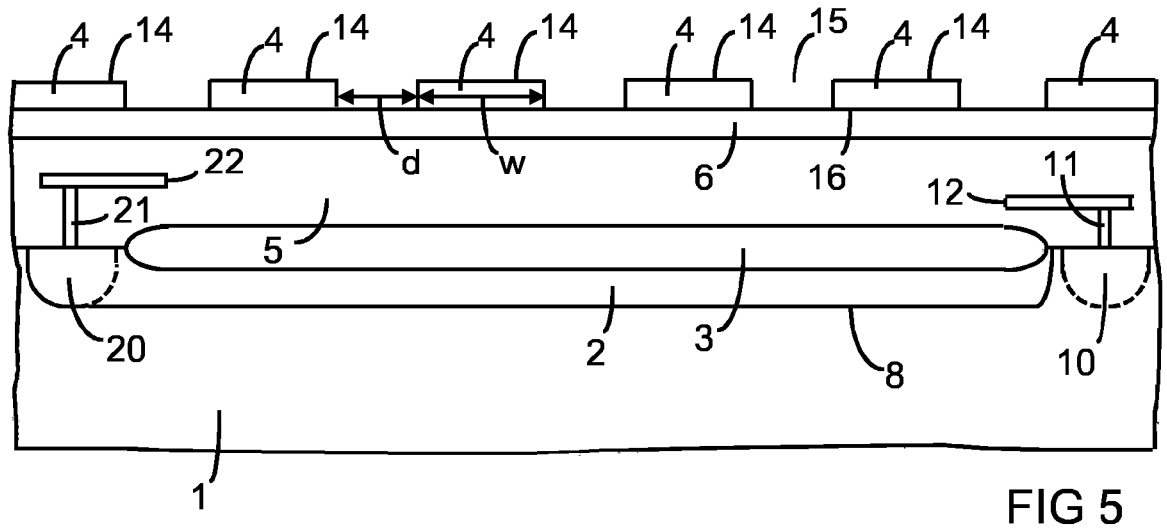
FIG. 5 is a cross section according to FIG. 1 for a photodetector device with a different arrangement of the high-contrast grating polarizer.

FIG. 5 is a cross section of a further photodetector device with a high-contrast grating polarizer. Elements that correspond to similar elements shown in FIG. 1 are designated with the same reference numerals. The photodetector device according to FIG. 5 differs from the photodetector device according to FIG. 1 in the arrangement of the grid elements 4. The dielectric layer 5 is an intermetal dielectric layer of a wiring or pad metallization, which comprises structured metallization layers. The contact 11 is connected to a metallization layer 12, and the further contact 21 is connected to a further metallization layer 22. A cover layer 6, which may be a passivation, for instance, is applied on the dielectric layer 5. In the photodetector device according to FIG. 5, the grid elements 4 are arranged on the surface 16 of the cover layer 6. The grid elements 4 may instead be arranged immediately on the dielectric layer 5. If the grid elements 4 comprise silicon nitride, their surface 14 may be exposed to ambient air 15 to yield a suitable high-contrast grating polarizer.

Figure 6:
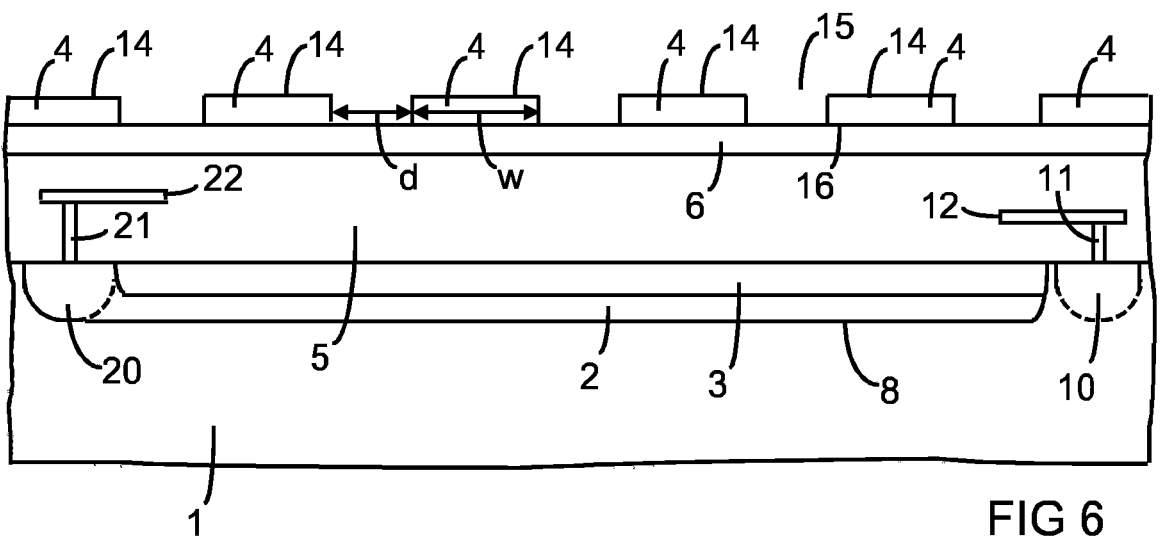
FIG. 6 is a cross section according to FIG. 5 for a further photodetector device with the different arrangement of the high-contrast grating polarizer.

FIG. 6 is a cross section of a further photodetector device with a high-contrast grating polarizer. Elements that correspond to similar elements shown in FIG. 5 are designated with the same reference numerals. The photodetector device according to FIG. 6 differs from the photodetector device according to FIG. 5 in the isolation region 3, which is formed as a shallow trench isolation (STI) as in the photodetector device according to FIG. 2. If the semiconductor material is silicon, the material of the isolation region 3 may be silicon dioxide, for instance.

The array of grid elements 4 forms a high-contrast grating, which is comparable to a resonator comprising a high quality-factor. For the vector component of the electric field vector that is parallel to the longitudinal extension of the grid elements 4, i. e., perpendicular to the plane of the cross sections shown in FIGS. 1 to 6, the high-contrast grating constitutes a reflector. Owing to the difference between the refractive indices, the optical path length of an incident electromagnetic wave is different in the grid elements 4 and in the sections of the further region of lower refractive index 5, 15 located between the grid elements 4. Hence an incident electromagnetic wave reaches the surface 13, 16 of the region of lower refractive index 3, 6, which forms the base of the high-contrast grating, with a phase shift between the portions that have passed a grid element 4 and the portions that have propagated between the grid elements 4. The high-contrast grating can be designed to make the phase shift π or 180° for a specified wavelength, so that the portions in question cancel each other. The high-contrast grating thus constitutes a reflector for a specified wavelength and polarization.

When the vector component of the electric field vector is transverse to the longitudinal extension of the grid elements 4, the electromagnetic wave passes the grid elements 4 essentially undisturbed and is absorbed within the substrate 1 underneath. Thus electron-hole pairs are generated in the semiconductor material. The charge carriers generated by the incident radiation produce an electric current, by which the radiation is detected. Optionally, a voltage is applied to the pn-junction 8 in the reverse direction.

The grid elements 4 may comprise a constant width w, and the distance d between adjacent grid elements 4 may also be constant, so that the high-contrast grating forms a regular lattice. The pitch p of such a grating, which defines a shortest period of the lattice, is the sum of the width w of one grid element 4 and the distance d. For the application of the array of grid elements 4 as a high-contrast grating polarizer, the pitch p is typically smaller than the wavelength of the electromagnetic radiation in the material of the region of lower refractive index $n_{low1}$ and/or in the further region of lower refractive index $n_{low2}$ or even smaller than the wavelength in the grid elements 4. In the region of lower refractive index $n_{low1}$ the wavelength $\lambda_0$ in vacuum of the electromagnetic radiation to be detected becomes $\lambda_1 = \lambda_0/n_{low1}$. In the further region of lower refractive index $n_{low2}$ the wavelength becomes $\lambda_2 = \lambda_0/n_{low2}$. If $n_{high}$ is the refractive index of the grid elements 4, the wavelength $\lambda_0$ becomes $\lambda_3 = \lambda_0/n_{high}$ in the grid elements 4, $\lambda_3 < \lambda_0/n_{low1}$, $\lambda_3 < \lambda_0/n_{low2}$. This dimension denotes a difference between the high-contrast grating used as a polarizer in the photodetector device described above and a conventional diffraction grating.

The pitch p may be larger than a quarter wavelength of the electromagnetic radiation in the grid elements 4. If the wavelength of the electromagnetic radiation to be detected is $\lambda_0$ in vacuum, $p > \lambda_3/4 = \lambda_0/(4n_{high})$. This distinguishes the high-contrast grating used as a polarizer in the photodetector device described above from deep-subwavelength gratings. The length 1 of the grid elements 4 is optionally larger than the wavelength $\lambda_3 = \lambda_0/n_{high}$ of the electromagnetic radiation in the grid elements 4.

Therefore, the high-contrast grating based polarizer alleviates the draw-backs of tight fabrication tolerance and layer thickness control as for diffraction gratings; and the necessity of very small structures and thus very advanced lithograph as for deep sub-wavelength gratings.

The photodetector device with high-contrast grating polarizer can be used for a broad range of applications. Further advantages include an improved extinction coefficient for states of polarization that are to be excluded and an enhanced responsivity for the desired state of polarization.

The invention claimed is:

1. A photodetector device, comprising:
   a substrate of semiconductor material,
   a sensor region in the substrate,
   a plurality of grid elements arranged at a distance from one another above the sensor region, the grid elements having a refractive index,
   a first region having a refractive index lower than the refractive index of the grid elements, the grid elements being arranged on the first region, and
   a further region having a refractive index lower than the refractive index of the grid elements, the further region covering the grid elements,
   wherein the grid elements have a width, and
   wherein the photodetector device is configured such that, during operation, the photodetector device detects electromagnetic radiation using the sensor region, and
   wherein the photodetector device is configured such that, during operation, the sum of the width and the distance between adjacent grid elements is smaller than a wavelength of the electromagnetic radiation in the grid elements.

2. The photodetector device according to claim 1, wherein the grid elements comprise a material selected from the group consisting of polysilicon, silicon nitride, hafnium dioxide, tantalum pent-oxide, silicon dioxide, and niobium pentoxide, or any combination thereof.

3. The photodetector device according to claim 1, wherein the first region is a shallow trench isolation, a buried oxide or a field oxide region formed in the substrate; and
   the further region comprises a dielectric layer.

4. The photodetector device according to claim 1, wherein the first region is a cover layer above the substrate; and
   the further region comprises ambient air.

5. The photodetector device according to claim 4, wherein the grid elements comprise silicon nitride.

6. The photodetector device according to claim 1, wherein the refractive index of the grid elements is at least 0.5 higher than the refractive index of the first region.

7. The photodetector device according to claim 1, wherein the refractive index of the grid elements is at least 0.5 higher than the refractive index of the further region.

8. The photodetector device according to claim 6, wherein the refractive index of the grid elements is at least 1.0 higher than the refractive index of the first region.

9. The photodetector device according to claim 7, wherein the refractive index of the grid elements is at least 1.0 higher than the refractive index of the further region.

10. The photodetector device according to claim 1, wherein for the electromagnetic radiation to be detected by the photodetector device, the sum of the width and the distance between adjacent grid elements is smaller than a wavelength of the electromagnetic radiation in the first region.

11. The photodetector device according to claim 1, wherein the photodetector device is configured such that, during operation, the sum of the width and the distance between adjacent grid elements is smaller than a wavelength of the electromagnetic radiation in the further region.

12. The photodetector device according to claim 1, wherein the photodetector device is configured such that, during operation, the sum of the width and the distance between adjacent grid elements is larger than a quarter of a wavelength of the electromagnetic radiation in the grid elements.

13. The photodetector device according to claim 1, wherein the grid elements have a length parallel to a direction of alignment; and
    wherein the photodetector device is configured such that, during operation, the length of the grid elements is larger than a wavelength of the electromagnetic radiation in the grid elements.

14. A photodetector device, comprising:
    a substrate of semiconductor material;
    a sensor region in the substrate;
    a plurality of grid elements arranged at a distance from one another above the sensor region, the grid elements having a refractive index;
    a first region having a refractive index lower than the refractive index of the grid elements, the first region formed in the substrate by a shallow trench isolation, a buried oxide or a field oxide region, the grid elements being arranged on the first region; and
    a further region having a refractive index lower than the refractive index of the grid elements, the further region comprising a dielectric layer, the further region covering the grid elements,
    wherein the grid elements have a width, and
    wherein the photodetector device is configured such that, during operation, the photodetector device detects electromagnetic radiation using the sensor region, and
    wherein the photodetector device is configured such that, during operation, the sum of the width and the distance between adjacent grid elements is smaller than a wavelength of the electromagnetic radiation in the grid elements.

15. A photodetector device, comprising:
    a substrate of semiconductor material;
    a sensor region in the substrate for the detection of electromagnetic radiation;
    a plurality of grid elements arranged at a distance from one another above the sensor region, the grid elements having a refractive index;
    a first region having a refractive index lower than the refractive index of the grid elements, the first region formed by a cover layer above the substrate, the grid elements being arranged on the first region; and
    a further region having a refractive index lower than the refractive index of the grid elements, the further region covering the grid elements, the further region comprising ambient air,
    wherein the grid elements have a width, and
    wherein the photodetector device is configured such that, during operation, the photodetector detects electromagnetic radiation using the sensor region, and wherein the photodetector device is configured such that, during operation, the sum of the width and the distance between adjacent grid elements is smaller than a wavelength of the electromagnetic radiation in the grid elements.

* * * * *